(12) United States Patent
Inazuki

(10) Patent No.: US 10,809,611 B2
(45) Date of Patent: Oct. 20, 2020

(54) METHOD FOR PREPARING HALFTONE PHASE SHIFT MASK BLANK, HALFTONE PHASE SHIFT MASK BLANK, HALFTONE PHASE SHIFT MASK, AND THIN FILM FORMING APPARATUS

(71) Applicant: SHIN-ETSU CHEMICAL CO., LTD., Tokyo (JP)

(72) Inventor: Yukio Inazuki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/584,021

(22) Filed: Sep. 26, 2019

(65) Prior Publication Data
US 2020/0026180 A1    Jan. 23, 2020

Related U.S. Application Data

(62) Division of application No. 15/674,709, filed on Aug. 11, 2017, now Pat. No. 10,466,582.

(30) Foreign Application Priority Data

Aug. 23, 2016  (JP) .................. 2016-162620

(51) Int. Cl.
| | |
|---|---|
| *G03F 1/32* | (2012.01) |
| *G03F 1/50* | (2012.01) |
| *C23C 14/00* | (2006.01) |
| *C23C 14/06* | (2006.01) |
| *C23C 14/34* | (2006.01) |
| *C23C 14/50* | (2006.01) |
| *G03F 1/60* | (2012.01) |
| *H01J 37/34* | (2006.01) |

(52) U.S. Cl.
CPC ............ *G03F 1/32* (2013.01); *C23C 14/0036* (2013.01); *C23C 14/0652* (2013.01); *C23C 14/3464* (2013.01); *C23C 14/505* (2013.01); *G03F 1/50* (2013.01); *G03F 1/60* (2013.01); *H01J 37/3417* (2013.01); *H01J 37/3426* (2013.01); *H01J 37/3464* (2013.01)

(58) Field of Classification Search
CPC ..... G03F 1/32; G03F 1/50; G03F 1/60; C23C 14/0036; C23C 14/0652; C23C 14/3464; C23C 14/505; H01J 37/3417; H01J 37/3426; H01J 37/3464
USPC ............................................................ 430/5
See application file for complete search history.

(56) References Cited

U.S. PATENT DOCUMENTS

| | | | |
|---|---|---|---|
| 5,830,607 | A | 11/1998 | Isao et al. |
| 7,771,893 | B2 | 8/2010 | Yoshikawa et al. |
| 8,012,654 | B2 | 9/2011 | Yoshikawa et al. |
| 9,366,951 | B2 | 6/2016 | Inazuki et al. |
| 2004/0191646 | A1 | 9/2004 | Yoshikawa et al. |
| 2004/0197679 | A1 | 10/2004 | Yoshikawa et al. |
| 2015/0338731 | A1 | 11/2015 | Nozawa et al. |

FOREIGN PATENT DOCUMENTS

| | | |
|---|---|---|
| EP | 2 871 520 A2 | 5/2015 |
| JP | 7-140635 A | 6/1995 |
| JP | 2003-253439 A | 9/2003 |
| JP | 2007-33469 A | 2/2007 |
| JP | 2007-233179 A | 9/2007 |
| JP | 2007-241065 A | 9/2007 |
| JP | 2015-111246 A | 6/2015 |

OTHER PUBLICATIONS

Extended European Search Report dated Jan. 5, 2018, in European Patent Application No. 17184764.3.
Office Action dated May 7, 2019, in Japanese Patent Application No. 2016-162620.

*Primary Examiner* — Christopher G Young
(74) *Attorney, Agent, or Firm* — Birch, Stewart, Kolasch & Birch, LLP

(57) ABSTRACT

A halftone phase shift mask blank comprising a transparent substrate and a halftone phase shift film thereon is prepared through the step of depositing the halftone phase shift film on the substrate by using a sputtering gas containing rare gas and nitrogen gas, and plural targets including at least two silicon targets, applying powers of different values to the silicon targets, effecting reactive sputtering, and rotating the substrate on its axis in a horizontal direction. The halftone phase shift film has satisfactory in-plane uniformity of optical properties.

4 Claims, 5 Drawing Sheets

METHOD FOR PREPARING HALFTONE PHASE SHIFT MASK BLANK, HALFTONE PHASE SHIFT MASK BLANK, HALFTONE PHASE SHIFT MASK, AND THIN FILM FORMING APPARATUS

CROSS-REFERENCE TO RELATED APPLICATIONS

This application is a Divisional application of co-pending application Ser. No. 15/674,709, filed on Aug. 11, 2017, which claims the benefit under 35 U.S.C. § 119(a) to Patent Application No. 2016-162620, filed in Japan on Aug. 23, 2016, all of which are hereby expressly incorporated by reference into the present application.

TECHNICAL FIELD

This invention relates to a halftone phase shift mask blank which is processed into a halftone phase shift mask for use in the microfabrication of semiconductor integrated circuits or the like, a method for preparing the same, a halftone phase shift mask, and an apparatus for forming a thin film for the mask blank.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing optical interference. One of the photomasks adapted for the phase shift method is a halftone phase shift mask. Typically, the halftone phase shift mask includes a substrate of quartz or similar material which is transparent to exposure light, and a photomask pattern of halftone phase shift film formed on the substrate, capable of providing a phase shift of approximately 180 degrees and having an insufficient transmittance to contribute to pattern formation. As the halftone phase shift mask, Patent Document 1 proposes a mask having a halftone phase shift film of molybdenum silicide oxide (MoSiO) or molybdenum silicide oxynitride (MoSiON).

For the purpose of forming finer images by photolithography, light of shorter wavelength is used as the light source. In the currently most advanced stage of lithography process, the exposure light source has made a transition from KrF excimer laser (248 nm) to ArF excimer laser (193 nm).

CITATION LIST

Patent Document 1: JP-A H07-140635
Patent Document 2: JP-A 2015-111246 (U.S. Pat. No. 9,366, 951, EP 2871520)
Patent Document 3: JP-A 2007-033469
Patent Document 4: JP-A 2007-233179
Patent Document 5: JP-A 2007-241065

SUMMARY OF INVENTION

It is known from Patent Document 2 that a halftone phase shift film is improved in chemical resistance by constructing it from a film consisting of silicon, nitrogen and optionally oxygen, for example, a transition metal-free film consisting of silicon and nitrogen, or a transition metal-free film consisting of silicon, nitrogen and oxygen.

In general, a thin film, typically halftone phase shift film, for forming a pattern on a photomask blank is deposited by the sputtering method. For example, a film consisting of silicon and nitrogen (SiN film) is formed on a transparent substrate by a sputtering process which involves the steps of placing a single silicon target in a deposition chamber, feeding a gas mixture of a rare gas such as argon and nitrogen gas to the chamber, applying an electric power to create a gas plasma, and letting the plasma atoms impinge the silicon target to sputter silicon particles. The thus sputtered silicon particles react with nitrogen on the target surface, take up nitrogen on their way to the substrate, or react with nitrogen on the substrate. The resulting silicon nitride deposits on the substrate. The nitrogen content of the SiN film is controlled by changing the mixing ratio of nitrogen gas in the gas mixture. The process enables to deposit a SiN film having any desired nitrogen content on a transparent substrate.

When a halftone phase shift film of silicon nitride is deposited by sputtering a single silicon target, however, film deposition must be carried out by setting the flow rate of nitrogen gas such that the film may have desired values of phase shift and transmittance (for example, phase shift median 180±300 and transmittance 3-7%). Due to characteristics of reactive sputtering, stable film deposition becomes difficult in a certain range of nitrogen gas flow rate. Particularly in a region where the nitrogen gas flow rate ranges from a low to moderate level (film deposition conditions of transition mode), stable film deposition is difficult. In such a flow rate range, a slight variation of nitrogen flow rate leads to a significant variation of film deposition state. As a result, the halftone phase shift film has largely varying optical properties. In particular, it is difficult to form a halftone phase shift film having in-plane uniformity of its essential optical properties including phase shift and transmittance.

Meanwhile, these problems rarely arise in a region where no nitriding occurs on the target surface even when nitrogen is introduced and so a film with a low nitrogen content is deposited (film deposition conditions of metal mode) and a region where the flow rate of nitrogen gas is high, the target surface is nitrided, and so a film with a high nitrogen content is deposited (film deposition conditions of reaction mode). Therefore, the problems may be avoided by combining sputtering steps in these regions to form a halftone phase shift film of multilayer structure including a low nitrogen content layer and a high nitrogen content layer. The halftone phase shift film of multilayer structure has high in-plane uniformity of optical properties, but is compositionally graded stepwise in thickness direction. When this halftone phase shift film is processed into a halftone phase shift film pattern, the pattern is less vertical in cross-sectional shape.

An object of the invention is to provide a method for preparing a halftone phase shift mask blank comprising a halftone phase shift film wherein the halftone phase shift film contains silicon and nitrogen, and has good in-plane uniformity of optical properties, and when the halftone phase shift film is processed into a halftone phase shift film pattern, the pattern is fully vertical in cross-sectional shape. Another object is to provide a halftone phase shift mask blank having the halftone phase shift film, a halftone phase shift mask having a mask pattern of the halftone phase shift film, and an apparatus for forming a thin film to construct the mask blank.

The inventor sought for a halftone phase shift film which is composed mainly of silicon and nitrogen, and consists of a single layer whose composition is kept constant or continuously graded in thickness direction, or two layers including the single layer and a surface oxidized layer disposed on a side of the single layer remote from the substrate. The halftone phase shift film can be effectively deposited on a surface of a transparent substrate by using a sputtering gas containing a rare gas and a nitrogen-containing gas, and plural targets, applying powers of different values to the plural targets, effecting reactive sputtering, and rotating the substrate on its axis in a horizontal direction. When this halftone phase shift film is processed into a halftone phase shift film pattern, the pattern is fully vertical in cross-sectional shape. While the halftone phase shift film consists of a single layer or two layers including the single layer and a surface oxidized layer, the film provides a phase shift and transmittance relative to the wavelength of ArF excimer laser, the phase shift having a median in film plane of 180±300 and the transmittance having a median in film plane of 3 to 17%. Even in the case of reactive sputtering under film deposition conditions of transition mode where a film is deposited in a region of reactive gas flow rate ranging from a low to moderate level, there is obtained a halftone phase shift film having high in-plane uniformity of optical properties including phase shift and transmittance. The invention is predicated on these findings.

The invention provides a method for preparing a halftone phase shift mask blank, halftone phase shift mask blank, halftone phase shift mask, and apparatus for forming a thin film to construct the mask blank, as defined below.

In one aspect, the invention provides a method for preparing a halftone phase shift mask blank comprising a transparent substrate and a halftone phase shift film thereon, the halftone phase shift film being composed mainly of silicon and nitrogen, consisting of a single layer whose composition is kept constant or continuously graded in thickness direction, or two layers including the single layer and a surface oxidized layer disposed on a side of the single layer remote from the substrate, providing a phase shift relative to the wavelength of ArF excimer laser, the phase shift having a median in film plane of 180±30° and a difference between maximum and minimum in film plane of up to 2°, and having a transmittance relative to the wavelength of ArF excimer laser, the transmittance having a median in film plane of 3 to 17% and a difference between maximum and minimum in film plane of up to 0.2%, the method comprising the step of depositing the halftone phase shift film on a surface of the substrate by using a sputtering gas containing a rare gas and a nitrogen-containing gas, and plural targets including at least two silicon targets, applying powers of at least two different values to the at least two silicon targets, effecting reactive sputtering, and rotating the substrate on its axis in a horizontal direction.

In a preferred embodiment, the deposition step includes reactive sputtering in transition mode so that the halftone phase shift film is formed of an unsaturated silicon compound.

Preferably in the sputter deposition step, the plural targets are arranged such that provided that the axis of rotation of the substrate and a vertical line passing the center of a sputter surface of each of the plural targets are parallel and spaced apart a distance, one target has the closest distance between the rotational axis and the vertical line: the distance between the rotational axis and the vertical line of another target is 1 to 3 times the distance between the rotational axis and the vertical line of the one target, and the angle included between normal lines extending from the rotational axis to vertical lines has a maximum value of 70° to 180°.

In a preferred embodiment, at least two normal lines extend from the rotational axis to vertical lines, and any of the angles included between adjacent normal lines is in a range of 70° to 180°.

Most preferably, the plural targets are silicon targets.

In a preferred embodiment, the single layer has a total content of silicon and nitrogen of at least 98 at %, and the surface oxidized layer contains silicon, nitrogen and oxygen.

In another aspect, the invention provides a halftone phase shift mask blank comprising a transparent substrate and a halftone phase shift film thereon, the halftone phase shift film being composed mainly of silicon and nitrogen, consisting of a single layer whose composition is kept constant or continuously graded in thickness direction, or two layers including the single layer and a surface oxidized layer disposed on a side of the single layer remote from the substrate, providing a phase shift relative to the wavelength of ArF excimer laser, the phase shift having a median in film plane of 180±30° and a difference between maximum and minimum in film plane of up to 2°, and having a transmittance relative to the wavelength of ArF excimer laser, the transmittance having a median in film plane of 3 to 17% and a difference between maximum and minimum in film plane of up to 0.2%.

In a preferred embodiment, the single layer has a total content of silicon and nitrogen of at least 98 at %, and the surface oxidized layer contains silicon, nitrogen and oxygen.

In a further aspect, the invention provides a halftone phase shift mask comprising a transparent substrate and a mask pattern of the halftone phase shift film in the halftone phase shift mask blank defined above.

In a still further aspect, the invention provides an apparatus for forming a thin film to constitute a photomask blank, comprising a substrate to constitute the photomask blank, plural targets, a gas supply for supplying a sputtering gas containing a rare gas and a nitrogen-containing gas, and means for causing electric discharge to the plural targets at the same time, wherein the thin film to constitute a photomask blank is formed by rotating the substrate on its axis, sputtering the plural targets, and depositing a thin film on the substrate, the plural targets are disposed such that provided that the rotational axis of the substrate and a vertical line passing the center of a sputter surface of each of the plural targets are parallel and spaced apart a distance, one target has the closest distance between the rotational axis and the vertical line, the distance between the rotational axis and the vertical line of another target is 1 to 3 times the distance between the rotational axis and the vertical line of the one target, and the angle included between normal lines extending from the rotational axis to vertical lines has a maximum value of 70° to 180°.

In a preferred embodiment, at least two normal lines extend from the rotational axis to vertical lines, and any of the angles included between adjacent normal lines is in a range of 700 to 180°.

Most preferably, the plural targets are silicon targets.

In a preferred embodiment, a halftone phase shift film formed of an unsaturated silicon compound is deposited on the substrate by reactive sputtering in transition mode.

Advantageous Effects of Invention

The halftone phase shift film containing silicon and nitrogen has chemical resistance and good in-plane uniformity of optical properties. When the halftone phase shift film is processed into a halftone phase shift film pattern, the pattern is fully vertical in cross-sectional shape. There are obtained a halftone phase shift mask blank comprising the halftone phase shift film, and a halftone phase shift mask comprising a mask pattern of the halftone phase shift film.

DESCRIPTION OF PREFERRED EMBODIMENTS

Figure 1:
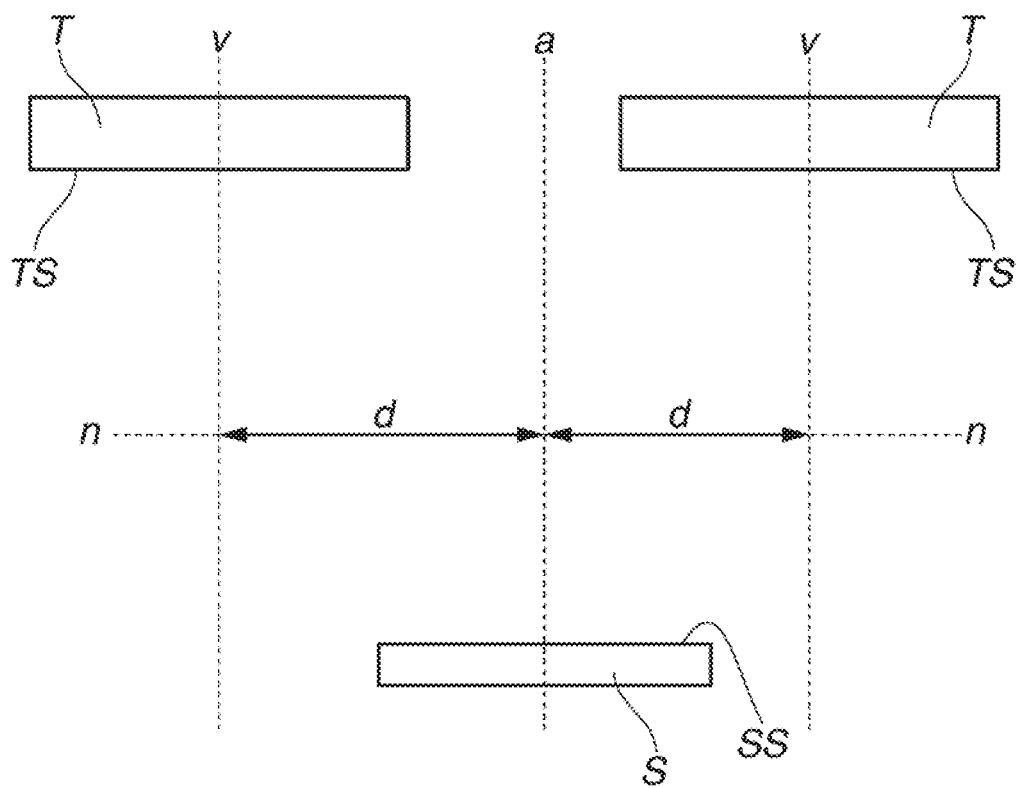
FIG. 1 is an elevational view showing one exemplary arrangement of a transparent substrate and targets.

The invention is directed to a halftone phase shift mask blank comprising a transparent substrate and a halftone phase shift film formed thereon. According to the inventive method, the halftone phase shift film is deposited on the substrate by reactive sputtering. The sputtering step uses a sputtering gas containing a rare gas and a reactive gas. A nitrogen-containing gas is essential as the reactive gas, which reacts with the target material, during deposition of the halftone phase shift film, to form part of the film. Specifically, a choice may be made of nitrogen gas ($N_2$ gas) and nitrogen oxide gases ($N_2O$, $NO$ and $NO_2$ gases), depending on a particular composition of the halftone phase shift film. Where an oxygen-free film is to be deposited, nitrogen gas ($N_2$ gas) is used. The sputtering gas contains helium gas, neon gas or argon gas as the rare gas. Depending on a particular composition of the halftone phase shift film, another gas such as oxygen gas ($O_2$ gas) or carbon oxide gases ($CO$ and $CO_2$ gases) may be additionally used. The content of nitrogen and the contents of other light elements such as oxygen and carbon in the halftone phase shift film may be controlled by adjusting the flow rate of sputtering gas, especially reactive gas and the powers applied to targets (to be described below). Sputtering conditions are adjusted such that the film deposition rate may fall in an appropriate range.

For sputtering, a plurality of targets are used. The number of targets may be 2, 3 or more. A relatively small number of targets are preferred in view of a particle generating source (that can be introduced by a complex arrangement of targets in the deposition chamber) and target exchange operation. Thus the number of targets is typically up to 5. Although powers of the same value may be applied to the plural targets, preferably powers of different values are applied to some or all of the plural targets. Typically powers in a range of 100 to 5,000 W are applied although the power varies with the area of a target, the construction of a power supply, and a target cooling system. When plural targets are used, and powers are applied to the targets at the same time, preferably powers of different values are applied to some or all of the plural targets to provoke sputtering discharges, a halftone phase shift film deposited is improved in the in-plane distribution of optical properties over the use of a single target.

The plural targets should include at least two silicon targets (Si targets, i.e., targets consisting of Si), and preferably all are silicon targets. To the plural silicon targets, powers of different values are applied. Specifically, when two silicon targets are used, powers of different values are applied thereto. When three or more silicon targets are used, powers of mutually different values may be applied, or a power of identical value may be applied to some targets and a power of different value may be applied to the remaining target (or powers of different values may be applied to the remaining targets).

Where a target other than the silicon targets is used, which means that three or more targets are used in total, the other target may be a silicon-containing target such as a silicon nitride target or a target containing both silicon and silicon nitride, depending on a particular composition of the halftone phase shift film. Then, a transition metal-free halftone phase shift film, specifically a halftone phase shift film of silicon base material such as SiN, SiNO, SiNOC or SiNC may be formed.

Also, depending on a particular composition of the halftone phase shift film, a target containing a transition metal (Me) such as molybdenum, tungsten, tantalum or zirconium may be used along with a silicon-containing target. Exemplary of the transition metal-containing target are a transition metal target and transition metal-silicon targets. Then, a transition metal-containing halftone phase shift film, specifically a halftone phase shift film of transition metal-silicon base material such as MeSiN, MeSiNO, MeSiNOC or MeSiNC may be formed.

In the sputtering process, particles are sputtered or dislodged from a surface of a target upon application of a power across the target to cause electric discharge, and then deposited onto a surface of a recipient, which is opposed to the target, such as a transparent substrate or photomask blank-constructing substrate. As used herein, the target surface is referred to as "sputter surface" and the recipient surface is referred to as "receptive surface." The size of a target, typically the size of sputter surface of a target is generally a diameter of 100 to 300 mm, when sputter deposition is to a transparent substrate of 6 inches squares and 25 mil thick, known as 6025 substrate, as prescribed in the SEMI standards. All targets may be of an identical size, or some or all targets may be of different sizes.

In the practice of the invention, since powers of at least two different values are applied to silicon targets, it is essential to perform sputter deposition while keeping the receptive surface of a transparent substrate horizontal and rotating the substrate on its axis in order to ensure the uniformity of sputter deposition on various portions of the substrate. The preferred setting is such that the axis of rotation passes the transparent substrate at its center because the sputter region may be minimized and the uniformity of sputter deposition be enhanced. During the sputtering process, the substrate may be further horizontally revolved, horizontally oscillated or vertically moved up and down. The sputtering process may be either DC or RF sputtering. The sputtering pressure is typically 0.01 to 1 Pa, preferably 0.03 to 0.2 Pa.

The step of sputter deposition of a halftone phase shift film preferably includes reactive sputtering of transition mode such that the halftone phase shift film may be formed of an unsaturated silicon compound. As used herein, the "transition mode" refers to the state that particles sputtered or dislodged from the target become a silicon compound satisfying the unsaturated composition (i.e., A or B value in excess of 1) and form a film on a transparent substrate, and is generally available in a low-to-moderate region of reactive gas flow rate. For the sputter deposition of transition mode, it is necessary to set different conditions, depending on the type of targets and the type of sputtering gas, especially reactive gas. Typically, the sputter deposition of transition mode is achievable by adjusting the powers applied to targets and the flow rate of sputtering gas, especially reactive gas to low-to-moderate ranges.

The "reaction mode" refers to the state that particles sputtered or dislodged from the target become a silicon compound satisfying the saturated composition (i.e., A or B value=1) and form a film on a transparent substrate, and is generally available in a high region of reactive gas flow rate. For the sputter deposition of reaction mode, it is necessary to set different conditions, depending on the type of targets and the type of sputtering gas, especially reactive gas. Typically, the sputter deposition of reaction mode is achievable by adjusting the powers applied to targets and the flow rate of sputtering gas, especially reactive gas to high ranges. The "metal mode" refers to the state that particles sputtered or dislodged from the target remain in metal state (metal inclusive of silicon) not having reacted with reactive gas and form a film on a transparent substrate. The sputter deposition of metal mode is achievable by adjusting the flow rate of reactive gas to a low range, especially omitting the reactive gas (flow rate of reactive gas=0).

Whether the sputter deposition state is of transition mode, reaction mode or metal mode may be confirmed by actually performing sputtering under predetermined conditions and analyzing the composition of the resulting film. It is noted that when two or more targets are used, in some cases, all the targets may take the transition mode, and in cases where the powers applied to the targets are different the targets may take different modes. For example, even under deposition conditions where the flow rate of reactive gas is identical, if the power applied to a target is high, the amount of metal sputtered is large, and reaction does not proceed, resulting in the transition mode of releasing unsaturated silicon compound; and if the power applied to a target is low, the amount of metal sputtered is small, and reaction proceeds, resulting in the reaction mode of releasing saturated silicon compound. When a single layer film having a constant composition in thickness direction is formed, it suffices that at least one target is sputtered in transition mode. When one or more targets are sputtered in transition mode, the remaining target(s) may be sputtered in either reaction or metal mode.

When a single layer film having a composition continuously graded in thickness direction is formed, the powers applied to targets and the flow rate of sputtering gas, especially reactive gas are changed continuously or step-wise, i.e., in many steps of short intervals. In these cases, it suffices that at least one target is sputtered in transition mode, during part or the entirety of sputtering process. When one or more targets are sputtered in transition mode, the remaining target(s) may be sputtered in either reaction or metal mode, and in this case, the sputtering process may pass the reaction or metal mode.

When a single layer film having a constant composition in thickness direction is formed, and when a single layer film having a composition continuously graded in thickness direction is formed, it is more effective in view of in-plane uniformity of optical properties of the halftone phase shift film that all targets are sputtered in transition mode.

It is assumed that the substrate has an axis of rotation, a vertical line passes the center of a sputter surface of each of the plural targets, the rotational axis and the vertical line are parallel and spaced apart a distance, and one target has the closest distance between the rotational axis and the vertical line. The plural targets are preferably arranged such that the distance between the rotational axis and the vertical line of another target or targets is 1 to 3 times, more preferably 1 to 2 times, and even more preferably 1 to 1.5 times the (closest) distance between the rotational axis and the vertical line of the one target. More preferably, all the targets are arranged on any of two, three or more concentric circles about the rotational axis of the substrate. Most preferably plural targets are arranged such that the distance between the rotational axis and the vertical line of another target or targets is equal to the distance between the rotational axis and the vertical line of the one target (having the closest distance between the rotational axis and the vertical line), that is, all targets are arranged on one concentric circle about the rotational axis of the substrate.

On the assumption that the substrate has an axis of rotation and a vertical line passes the center of a sputter surface of each of the plural targets, the plural targets are preferably arranged such that the angle included between normal lines extending from the rotational axis to vertical lines has a maximum value of 70° to 180°. In a preferred embodiment, the plural targets are arranged such that at least two normal lines extend from the rotational axis to vertical lines, and any of the angles included between adjacent normal lines ranges from 70°, especially from 120°, to 180°, preferably to less than 180°, and especially to 140°.

The above-mentioned arrangement of plural targets is effective in a thin film-forming system (sputtering system) wherein a thin film such as halftone phase shift film is deposited on a recipient (e.g., photomask blank-constructing substrate such as transparent substrate) by sputtering plural targets while rotating the recipient on its axis of rotation. The thin film-forming system preferably include a sputter chamber, a gas supply for supplying a sputtering gas containing a rare gas such as argon gas and a nitrogen-containing gas such as nitrogen gas, and means for provoking electric discharges to the plural targets at the same time. The means is preferably capable of applying electric powers to the plural targets at the same time, preferably applying electric powers of different values to some or all targets, thereby provoking sputtering discharges.

Now referring to the accompanying figures, the axis of rotation of the transparent substrate, vertical lines extending through the targets, the distance between the rotational axis and the vertical line, normal lines extending from the rotational axis of the substrate to the vertical lines through the targets, the direction of the normal line, and the angle between normal lines are described. FIG. 1 is an elevational view showing one exemplary arrangement of a transparent substrate S and targets T. The substrate S has a receptive surface SS which is kept horizontal, and a rotational axis "a" passing the center of substrate S and extending perpendicular to the receptive surface SS (i.e., in vertical or gravity direction). On the other hand, each target T has a sputter surface TS, and a vertical line "v" passing the center of the sputter surface TS of target T and extending perpendicular to the receptive surface SS of the substrate (i.e., in vertical or gravity direction). The sputter surface TS of target T is parallel to the receptive surface SS of substrate S, that is, kept horizontal. The targets may be inclined as long as the sputter surface of each target faces the receptive surface of the substrate. In this case too, the vertical line passes the center of the sputter surface of each target. The distance "d" between the vertical line "v" through target T and the rotational axis "a" of substrate S is equal to the distance between rotational axis "a" and vertical line "v" on a normal line "n".

FIGS. 2A, 2B, 3A and 3B are plan views showing exemplary arrangements of transparent substrate S and targets T. For each target T, a normal line "n" extending from the rotational axis of substrate S to a vertical line through the target and the direction of the normal line are provided. The targets are arranged such that the maximum of angles between normal lines falls in the predetermined range, and more preferably there are three or more directions of normal lines to vertical lines and the angles included between any two adjacent normal lines fall within the predetermined range. In this case too, the distance "d" between the vertical line (not shown) through target T and the rotational axis (not shown) of substrate S is equal to the distance between the rotational axis and the vertical line on normal line "n". Specifically, referring to FIG. 2A, the angle θ included between normal lines "n" associated with two targets T is maximum and falls within the predetermined range, and there are two directions of normal lines "n" to vertical lines through the targets, and the angle included between the directions of a pair of adjacent normal lines "n" falls within the predetermined range.

Figure 2A:
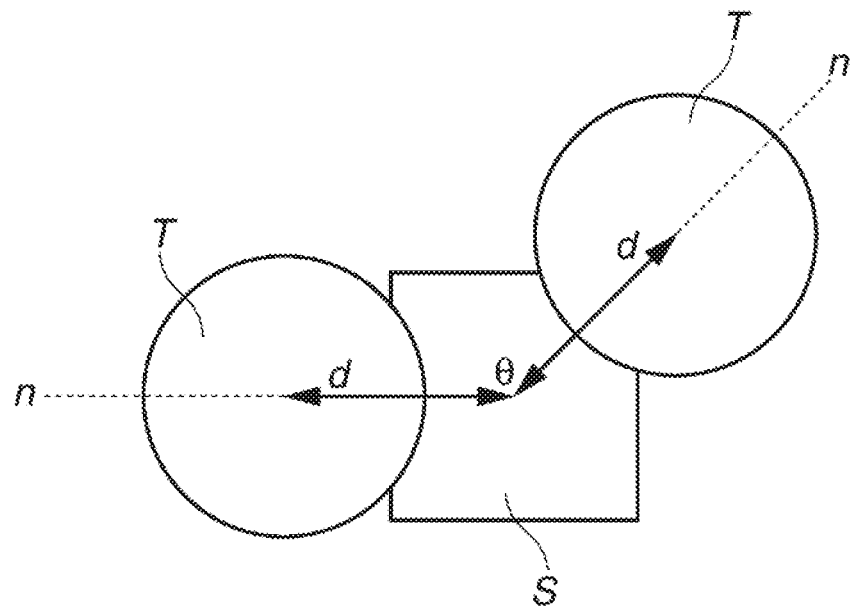
FIG. 2A is a plan view showing one exemplary arrangement of a transparent substrate and targets.
Figure 2B:
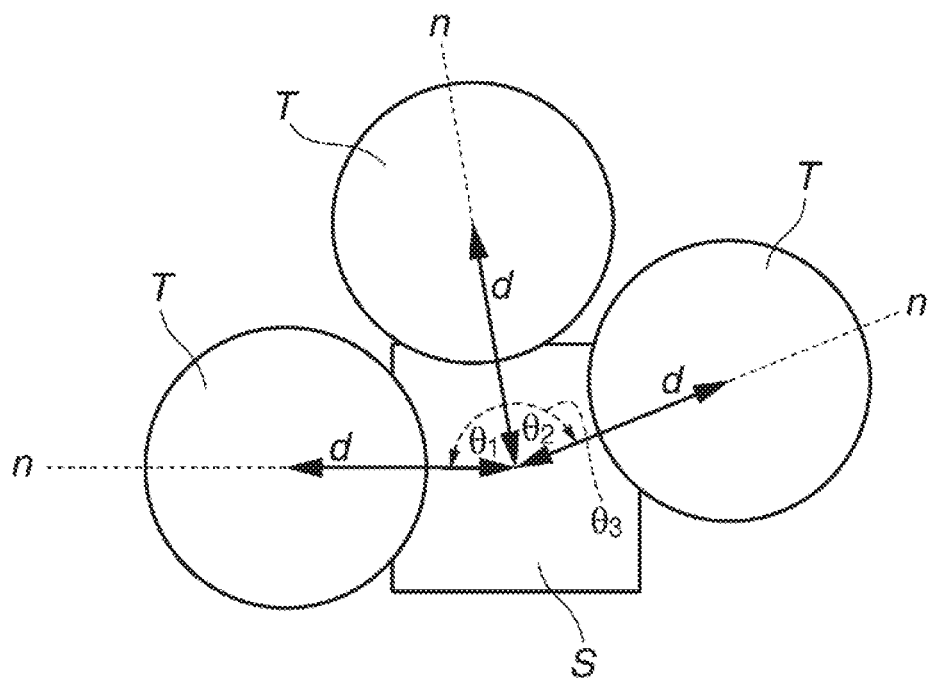
FIG. 2B is a plan view showing another arrangement of a transparent substrate and targets.
Figure 3A:
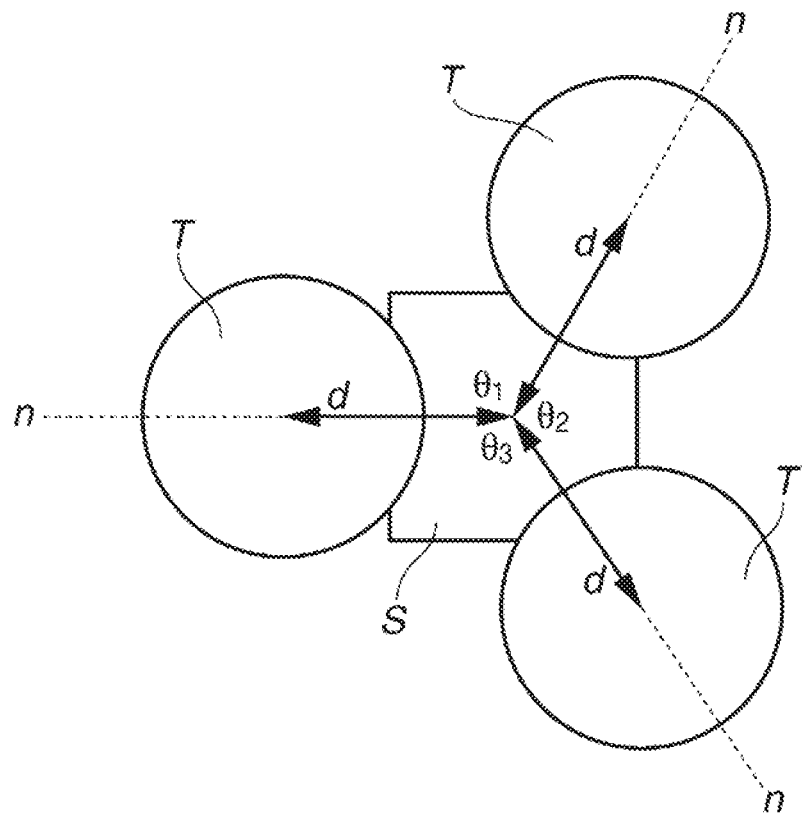
FIG. 3A is a plan view showing a further arrangement of a transparent substrate and targets.

In the arrangement of FIG. 2B, the maximum θ3 among the three angles θ1, θ2 and θ3 included between normal lines "n" associated with three targets T falls within the predetermined range. In the arrangement of FIG. 3(A), the maximum θ3 among the three angles θ1, θ2 and θ3 included between normal lines "n" associated with three targets T falls within the predetermined range. There are three directions of normal lines "n" to vertical lines through the targets, and the angles θ1, θ2 and θ3 included between the directions of three pairs of adjacent normal lines "n" fall within the predetermined range.

Figure 3B:
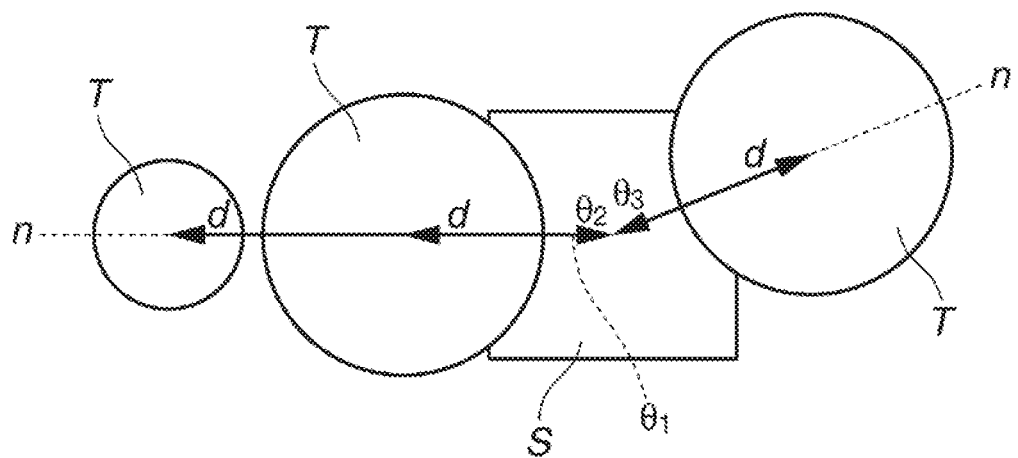
FIG. 3B is a plan view showing a still further arrangement of a transparent substrate and targets.

In the arrangement of FIG. 3B, the maximum θ2, θ3 among the three angles θ1, θ2 and θ3 included between normal lines "n" associated with three targets T falls within the predetermined range (specifically, θ2=θ3, and θ1=0°), and there are two directions of normal lines "n" to vertical lines through the targets, and the angle θ2, θ3 included between the directions of a pair of adjacent normal lines "n" falls within the predetermined range. Where three or more targets are used, the targets may be arranged such that all normal lines associated therewith are in different directions, or normal lines associated with two or more targets are in an identical direction, and the direction of normal line associated with another target is different from the overlapped normal line direction. In the latter embodiment wherein the targets have the overlapped normal line, the vertical lines through these targets are aligned with the overlapped normal line.

As discussed above, targets are arranged such that the maximum of the angles included between normal lines extending from the rotational axis of the substrate to the vertical lines through the targets falls in the predetermined range, and targets having different directions of normal lines thereto are arranged such that a predetermined angle is included between the directions of adjacent normal lines. Then a halftone phase shift film having improved in-plane uniformity of optical properties is obtained. If targets are arranged in one direction, spots of low reactive gas concentration are locally created during sputtering, leading to low uniformity of reaction within the sputtering space. That is, variations occur in the progress of reaction of target metal and reactive gas at any of the sputter surface of targets, sputtered particles, and the receptive surface of substrate. The arrangement of targets according to the invention ensures the uniformity of reaction of target metal with reactive gas within the sputtering space, and eventually enhances the in-plane uniformity of optical properties of the resulting halftone phase shift film.

The halftone phase shift mask blank of the invention is defined as comprising a transparent substrate, typically quartz substrate and a halftone phase shift film disposed thereon directly or via another film. Preference is given to transparent substrates of 6 inch squares and 25 mil thick, known as 6025 substrate, as prescribed in the SEMI standards, or transparent substrates of 152 mm squares and 6.35 mm thick when expressed in the SI units. The halftone phase shift mask has a (photo)mask pattern of the halftone phase shift film.

The halftone phase shift film is composed mainly of silicon and nitrogen. In one embodiment, the film consists of a single layer whose composition is kept constant or continuously graded in thickness direction. The continuously graded composition means that the composition changes so little that no inflection point is detected on compositional analysis. Since sputtering characteristics suggest a moderate response of a film composition change to changes of sputtering conditions, a continuous grading of composition may be obtained by changing sputtering conditions such as the powers applied to the targets and the flow rate of sputtering gas, especially reactive gas, in many steps of short intervals. Preferably a continuous grading of composition is obtained by continuously changing sputtering conditions.

Figure 4A:
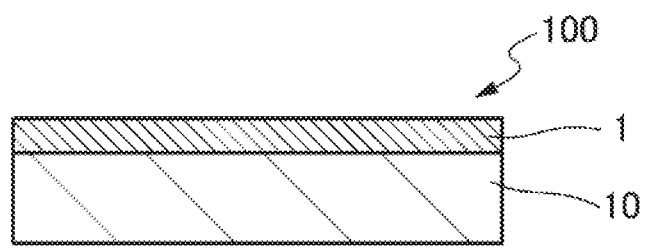
FIG. 4A is a cross-sectional view of one exemplary halftone phase shift mask blank.
Figure 4B:
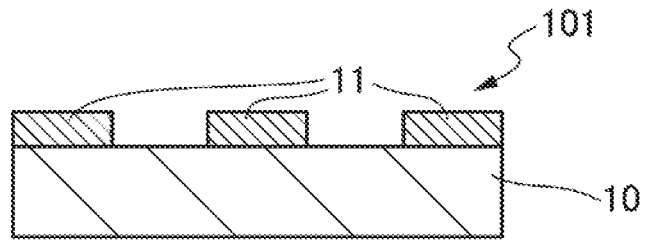
FIG. 4B is a cross-sectional view of one exemplary halftone phase shift mask.

FIG. 4A is a cross-sectional view of a halftone phase shift mask blank in one embodiment of the invention. The halftone phase shift mask blank 100 includes a transparent substrate 10 and a halftone phase shift film 1 formed thereon. FIG. 4B is a cross-sectional view of a halftone phase shift mask in one embodiment of the invention. The halftone phase shift mask 101 includes a transparent substrate 10 and a halftone phase shift film pattern 11 formed thereon.

In the embodiment wherein the halftone phase shift film is a single layer film, it contains silicon and nitrogen. Preferably the film is composed mainly of silicon and nitrogen. Specifically a total content of silicon and nitrogen is at least 90 at %, more preferably at least 95 at %, and even more preferably at least 98 at %. The silicon content is preferably at least 35 at %, more preferably at least 42 at % and up to 50 at %, more preferably up to 48 at %. The nitrogen content is preferably at least 45 at %, more preferably at least 50 at % and up to 57 at %, more preferably up to 55 at %. In addition to silicon and nitrogen, the single layer film that constitutes the halftone phase shift film may contain a transition metal such as molybdenum, tungsten, tantalum or zirconium, especially molybdenum. In this case, the content of transition metal is preferably up to 5 at %. Besides nitrogen, the film may contain a light element such as oxygen or carbon, and in this case, the content of light element (other than nitrogen) is preferably up to 5 at %. Preferably the single layer film that constitutes the halftone phase shift film consists of silicon, nitrogen and oxygen, most preferably consists of silicon and nitrogen.

The halftone phase shift film may include a surface oxidized layer as the surface-side layer (or outermost layer) in order to suppress any change in quality of the film. Specifically, the halftone phase shift film may be constructed by two layers, a single layer film composed mainly of silicon and nitrogen and having a composition which is kept constant or continuously graded in thickness direction and a surface oxidized layer disposed on a side of the single layer film remote from the substrate. The thickness of the surface oxidized layer is preferably up to 10%, more preferably up to 5% of the overall thickness of the halftone phase shift film. The surface oxidized layer may have an oxygen content of at least 20 at %, with even an oxygen content of at least 50 at % being acceptable. In addition to oxygen, the surface oxidized layer preferably contains silicon and nitrogen and may further contain a transition metal such as molybdenum, tungsten, tantalum or zirconium, or a light element such as oxygen or carbon. Preferably the surface oxidized layer consists of silicon, nitrogen and oxygen.

The surface oxidized layer may be formed by atmospheric or air oxidation or forced oxidative treatment. Examples of forced oxidative treatment include treatment of a silicon-based material film with ozone gas or ozone water, and heating of a film at about 300° C. or higher in an oxygen-containing atmosphere, typically oxygen gas atmosphere by oven heating, lamp annealing or laser heating. The surface oxidized layer preferably has a thickness of up to 10 nm, more preferably up to 5 nm, and even more preferably up to 3 nm. The oxidized layer exerts its effect as long as its thickness is at least 1 nm. The surface oxidized layer is preferably formed by atmospheric oxidation or oxidative treatment as mentioned above in order that the layer contains least defects.

The halftone phase shift film is preferably formed of an unsaturated silicon compound. In the embodiment wherein the halftone phase shift film is a single layer film, the single layer film is preferably formed of an unsaturated silicon compound; in the embodiment wherein the halftone phase shift film includes the single layer film and a surface oxidized layer, one or both of the single layer film and the surface oxidized layer, especially at least the single layer film is preferably formed of an unsaturated silicon compound. On the assumption that the silicon compound consists of silicon and nitrogen, or silicon, nitrogen and oxygen and/or carbon, silicon is tetravalent, nitrogen is trivalent, oxygen is divalent, and carbon is tetravalent, the term "unsaturation" as used herein refers to a composition wherein the total of equivalents of nitrogen, oxygen and carbon is less than the equivalent of silicon. Specifically, a composition wherein a value of A which is calculated from the equation:

$$A = C_{Si} \times 4/(C_N \times 3 + C_O \times 2 + C_C \times 4)$$

wherein $C_{Si}$ is a silicon content, $C_N$ is a nitrogen content, $C_O$ is an oxygen content, and $C_C$ is a carbon content (all in at %) is in excess of 1 is an unsaturated composition. The unsaturated state may also be defined as a silicon compound having a Si—Si bond. The unsaturated composition may be obtained by sputtering in transition mode during sputter deposition of a halftone phase shift film.

Where the silicon compound of which the halftone phase shift film is constructed further contains a transition metal, the term "unsaturation" refers to a composition wherein the total of equivalents of nitrogen, oxygen and carbon is less than the total of equivalents of silicon and transition metal. For example, where the silicon compound contains hexavalent molybdenum as the transition metal, the term "unsaturation" refers to a composition wherein the total of equivalents of nitrogen, oxygen and carbon is less than the total of equivalents of silicon and molybdenum. Specifically, a composition wherein a value of B which is calculated from the equation:

$$B = (C_{Si} \times 4 + C_{Mo} \times 6)/(C_N \times 3 + C_O \times 2 + C_C \times 4)$$

wherein $C_{Si}$ is a silicon content, $C_{Mo}$ is a molybdenum content, $C_N$ is a nitrogen content, $C_O$ is an oxygen content, and $C_C$ is a carbon content (all in at %) is in excess of 1 is an unsaturated composition.

The upper limit of A and B values for unsaturated silicon compounds is typically up to 1.5, especially up to 1.3. In contrast to the unsaturated silicon compounds, silicon compounds whose composition has a A or B value of 1 may be designated saturated silicon compounds. The saturated state may also be defined as a silicon compound free of a Si—Si bond. The saturated composition may be obtained by sputtering in reaction mode during sputter deposition of a halftone phase shift film.

The phase shift of the halftone phase shift film with respect to exposure light is such that a phase shift between the exposure light transmitted by a region of phase shift film (phase shift region) and the exposure light transmitted by a neighboring region where the phase shift film is removed, causes interference of exposure light whereby contrast is increased. Specifically the phase shift is in a range of 180±30 degrees, i.e., from 150° to 210°. Although ordinary halftone phase shift films are set to a phase shift of approximately 180°, it is possible from the standpoint of contrast enhancement to adjust the phase shift below or beyond 180° rather than limiting to approximately 180°. For example, setting a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°. For the halftone phase shift film, the median of in-plane phase shift should preferably fall in the above-defined range. Further the difference between maximum and minimum of in-plane phase shift of the halftone phase shift film should preferably be up to 2°, especially up to 1°.

The halftone phase shift film has a transmittance of exposure light which is preferably at least 3%, more preferably at least 5%, and up to 17%, more preferably up to 12%. For the halftone phase shift film, the median of in-plane transmittance should preferably fall in the above-defined range. Further the difference between maximum and minimum of in-plane transmittance should preferably be up to 0.2%, especially up to 0.1%.

The overall thickness of the halftone phase shift film should preferably be up to 70 nm, more preferably up to 65 nm, because a thinner film facilitates to form a finer pattern. The overall thickness of the halftone phase shift film is typically at least 58 nm as lower limit.

In the halftone phase shift mask blank of the invention, a second film of single layer or multilayer structure may be formed on the halftone phase shift film. Most often, the second film is disposed contiguous to the halftone phase shift film. Examples of the second film include a light-shielding film, a combination of light-shielding film and antireflective film, and an auxiliary film which functions as a hard mask during subsequent pattern formation of the halftone phase shift film. When a third film is formed as will be described later, the second film may be utilized as an auxiliary film (etching stop film) which functions as an etching stopper during subsequent pattern formation of the third film. The second film is preferably composed of a chromium-containing material.

Figure 5A:
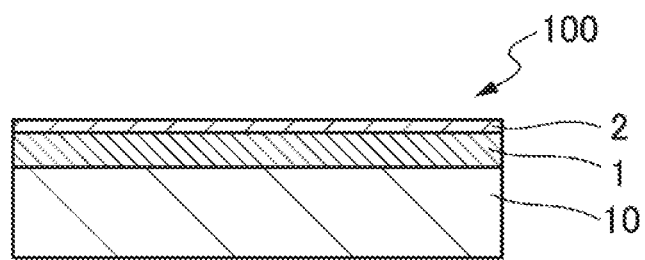
FIGS. 5A, 5B and 5C are cross-sectional views of different exemplary halftone phase shift mask blanks.

One exemplary embodiment is a halftone phase shift mask blank illustrated in FIG. 5A. The halftone phase shift photomask blank depicted at 100 in FIG. 5A includes a transparent substrate 10, a halftone phase shift film 1 formed on the substrate, and a second film 2 formed on the film 1.

The halftone phase shift mask blank may include a light-shielding film as the second film on the halftone phase shift film. A combination of a light-shielding film and an antireflective film may also be used as the second film. The provision of the second film including a light-shielding film ensures that a halftone phase shift mask includes a region capable of completely shielding exposure light. The light-shielding film and antireflective film may also be utilized as an auxiliary film during etching. The construction and material of the light-shielding film and antireflective film are known from many patent documents, for example, Patent Document 3 (JP-A 2007-033469) and Patent Document 4 (JP-A 2007-233179). One preferred film construction of the light-shielding film and antireflective film is a structure having a light-shielding film of Cr-containing material and an antireflective film of Cr-containing material for reducing reflection by the light-shielding film. Each of the light-shielding film and the antireflective film may be a single layer or multilayer. Suitable Cr-containing materials of which the light-shielding film and antireflective film are made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is a light-shielding film or a combination of a light-shielding film and an antireflective film, the light-shielding film is made of a chromium-based material having a chromium content of at least 40 at %, especially at least 60 at % and less than 100 at %, preferably up to 99 at %, and more preferably up to 90 at %. The chromium-based material has an oxygen content of at least 0 at % and up to 60 at %, preferably up to 40 at %, with an oxygen content of at least 1 at % being preferred when an etching rate must be adjusted. The chromium-based material has a nitrogen content of at least 0 at % and up to 50 at %, preferably up to 40 at %, with a nitrogen content of at least 1 at % being preferred when an etching rate must be adjusted. The chromium-based material has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a combination of a light-shielding film and an antireflective film, the antireflective film is preferably made of a chromium-containing material having a chromium content of preferably at least 30 at %, more preferably at least 35 at % and preferably up to 70 at %, and more preferably up to 50 at %. The chromium-containing material preferably has an oxygen content of up to 60 at %, and at least 1 at % and more preferably at least 20 at %. The chromium-containing material preferably has a nitrogen content of up to 50 at %, more preferably up to 30 at %, and at least 1 at %, more preferably at least 3 at %. The chromium-containing material preferably has a carbon content of at least 0 at % and up to 20 at %, more preferably up to 5 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a light-shielding film or a combination of a light-shielding film and an antireflective film, the second film has a thickness of typically 20 to 100 nm, preferably 40 to 70 nm. Also the halftone phase shift film combined with the second film should preferably have a total optical density of at least 2.0, more preferably at least 2.5, and even more preferably at least 3.0, with respect to exposure light of wavelength up to 200 nm.

In the halftone phase shift mask blank of the invention, a third film of single layer or multilayer structure may be formed on the second film. Most often, the third film is disposed contiguous to the second film. Examples of the third film include a light-shielding film, a combination of light-shielding film and antireflective film, and an auxiliary film which functions as a hard mask during subsequent pattern formation of the second film. The third film is preferably composed of a silicon-containing material, especially chromium-free silicon-containing material.

Figure 5B:
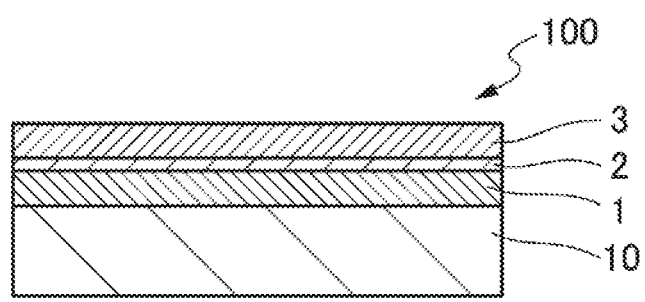

One exemplary embodiment is a halftone phase shift mask blank illustrated in FIG. 5B. The halftone phase shift mask blank depicted at 100 in FIG. 5B includes a transparent substrate 10, a halftone phase shift film 1 formed on the substrate, a second film 2 formed on the film 1, and a third film 3 formed on the second film 2.

Where the second film is a light-shielding film or a combination of a light-shielding film and an antireflective film, the third film may be an auxiliary film (etching mask film) which functions as a hard mask during subsequent pattern formation of the second film. When a fourth film is formed as will be described later, the third film may be utilized as an auxiliary film (etching stop film) which functions as an etching stopper during subsequent pattern formation of the fourth film. The auxiliary film is preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and one or both of nitrogen and oxygen, a material containing silicon and a transition metal, and a material containing silicon, one or both of nitrogen and oxygen, and a transition metal. Exemplary of the transition metal are molybdenum, tantalum and zirconium.

Where the third film is an auxiliary film, it is preferably composed of a silicon-containing material having a silicon content of preferably at least 20 at %, more preferably at least 33 at % and up to 95 at %, more preferably up to 80 at %. The silicon-containing material has a nitrogen content of at least 0 at % and up to 50 at %, preferably up to 30 at %, with a nitrogen content of at least 1 at % being preferred when an etching rate must be adjusted. The silicon-containing material has an oxygen content of at least 0 at %, preferably at least 20 at % and up to 70 at %, preferably up to 66 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is a light-shielding film or a combination of a light-shielding film and an antireflective film and the third film is an auxiliary film, the second film has a thickness of typically 20 to 100 nm, preferably 40 to 70 nm, and the third film has a thickness of typically 1 to 30 nm, preferably 2 to 15 nm. Also the halftone phase shift film combined with the second film should preferably have a total optical density of at least 2.0, more preferably at least 2.5, and even more preferably at least 3.0, with respect to exposure light of wavelength up to 200 nm.

Where the second film is an auxiliary film, a light-shielding film may be formed as the third film. Also, a combination of a light-shielding film and an antireflective film may be formed as the third film. Herein the second film may be utilized as an auxiliary film (etching mask film) which functions as a hard mask during pattern formation of the halftone phase shift film, or an auxiliary film (etching stop film) which functions as an etching stopper during pattern formation of the third film. Examples of the auxiliary film are films of chromium-containing materials as described in Patent Document 5 (JP-A 2007-241065). The auxiliary film may be a single layer or multilayer. Suitable chromium-containing materials of which the auxiliary film is made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is an auxiliary film, the film preferably has a chromium content of preferably at least 40 at %, more preferably at least 50 at % and up to 100 at %, more preferably up to 99 at %, and even more preferably up to 90 at %. The film has an oxygen content of at least 0 at %, and up to 60 at %, preferably up to 55 at %, with an oxygen content of at least 1 at % being preferred when an etching rate must be adjusted. The film has a nitrogen content of at least 0 at %, and up to 50 at %, preferably up to 40 at %, with a nitrogen content of at least 1 at % being preferred when an etching rate must be adjusted. The film has a carbon content of at least 0 at %, and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

On the other hand, the light-shielding film and antireflective film as the third film is preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and one or both of nitrogen and oxygen, a material containing silicon and a transition metal, and a material containing silicon, one or both of nitrogen and oxygen, and a transition metal. Exemplary of the transition metal are molybdenum, tantalum and zirconium.

Where the third film is a light-shielding film or a combination of a light-shielding film and an antireflective film, the light-shielding film and antireflective film are preferably composed of a silicon-containing material having a silicon content of preferably at least 10 at %, more preferably at least 30 at % and less than 100 at %, more preferably up to 95 at %. The silicon-containing material has a nitrogen content of at least 0 at/o and up to 50 at %, preferably up to 40 at %, especially up to 20 at %, with a nitrogen content of at least 1 at % being preferred when an etching rate must be adjusted. The silicon-containing material has an oxygen content of at least 0 at %, and up to 60 at %, preferably up to 30 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is an auxiliary film and the third film is a light-shielding film or a combination of a light-shielding film and an antireflective film, the second film has a thickness of typically 1 to 20 nm, preferably 2 to 10 nm, and the third film has a thickness of typically 20 to 100 nm, preferably 30 to 70 nm. Also the halftone phase shift film combined with the second and third films should preferably have a total optical density of at least 2.0, more preferably at least 2.5, and even more preferably at least 3.0, with respect to exposure light of wavelength up to 200 nm.

In the halftone phase shift mask blank of the invention, a fourth film of single layer or multilayer structure may be formed on the third film. Most often, the fourth film is disposed contiguous to the third film. Exemplary of the fourth film is an auxiliary film which functions as a hard mask during subsequent pattern formation of the third film. The fourth film is preferably composed of a chromium-containing material.

Figure 5C:
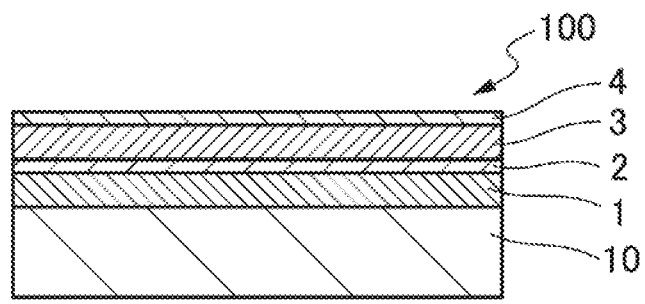

One exemplary embodiment is a halftone phase shift mask blank illustrated in FIG. 5C. The halftone phase shift mask blank depicted at 100 in FIG. 5C includes a transparent substrate 10, a halftone phase shift film 1 formed on the substrate, a second film 2 formed on the film 1, a third film 3 formed on the second film 2, and a fourth film 4 formed on the third film 3.

Where the third film is a light-shielding film or a combination of a light-shielding film and an antireflective film, the fourth film may be an auxiliary film (etching mask film) which functions as a hard mask during subsequent pattern formation of the third film. The auxiliary film is preferably composed of a material having different etching properties from the third film, for example, a material having resistance to fluorine dry etching applied to the etching of silicon-containing material, specifically a chromium-containing material which can be etched with oxygen-containing chloride gas. Suitable chromium-containing materials include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the fourth film is an auxiliary film, the film has a chromium content of at least 40 at %, preferably at least 50 at % and up to 100 at %, preferably up to 99 at %, and more preferably up to 90 at %. The film has an oxygen content of at least 0 at % and up to 60 at %, preferably up to 40 at %, with an oxygen content of at least 1 at % being preferred when an etching rate must be adjusted. The film has a nitrogen content of at least 0 at % and up to 50 at %, preferably up to 40 at %, with a nitrogen content of at least 1 at % being preferred when an etching rate must be adjusted. The film has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is an auxiliary film, the third film is a light-shielding film or a combination of a light-shielding film and an antireflective film, and the fourth film is an auxiliary film; the second film has a thickness of typically 1 to 20 nm, preferably 2 to 10 nm, the third film has a thickness of typically 20 to 100 nm, preferably 30 to 70 nm, and the fourth film has a thickness of typically 1 to 30 nm, preferably 2 to 20 nm. Also the halftone phase shift film combined with the second and third films should preferably have a total optical density of at least 2.0, more preferably at least 2.5, and even more preferably at least 3.0, with respect to exposure light of wavelength up to 200 nm.

The second and fourth films of chromium-containing materials may be deposited by reactive sputtering using a chromium target or a chromium target having one or more of oxygen, nitrogen and carbon added thereto, and a sputtering gas based on a rare gas such as Ar, He or Ne, to which a gas selected from oxygen-containing gas, nitrogen-containing gas and carbon-containing gas is added depending on the desired composition of a film to be deposited.

The third film of silicon-containing material may be deposited by reactive sputtering using a silicon target, silicon nitride target, target containing silicon and silicon nitride, transition metal target, or composite silicon/transition metal target, and a sputtering gas based on a rare gas such as Ar, He or Ne, to which a gas selected from oxygen-containing gas, nitrogen-containing gas and carbon-containing gas is added depending on the desired composition of a film to be deposited.

The halftone phase shift mask blank may be processed into a halftone phase shift mask by a standard technique. For example, a halftone phase shift photomask blank comprising only a halftone phase shift film deposited on a transparent substrate may be processed as follows. First, a resist film adapted for electron beam (EB) lithography is formed on the halftone phase shift film, exposed to a pattern of EB, and developed in a conventional way, forming a resist pattern. While the resist pattern thus obtained is used as etching mask, fluorine base dry etching is carried out for transferring the resist pattern to the halftone phase shift film, obtaining a pattern of the halftone phase shift film. The resist pattern is removed in a conventional manner, yielding a halftone phase shift mask.

In another example, a halftone phase shift mask blank comprising a halftone phase shift film and a second film of chromium-containing material deposited thereon may be processed into a mask as follows. First, a resist film adapted for EB lithography is formed on the second film of the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the second film, obtaining a pattern of the second film. Next, while the second film pattern is used as etching mask, fluorine base dry etching is carried out for transferring the pattern to the halftone phase shift film, obtaining a pattern of the halftone phase shift film. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift mask.

In a further example, a halftone phase shift mask blank comprising a halftone phase shift film, a light-shielding film or a light-shielding film/antireflective film of chromium-containing material deposited thereon as a second film, and an auxiliary film of silicon-containing material deposited thereon as a third film may be processed into a mask as follows. First, a resist film adapted for EB lithography is formed on the third film of the halftone phase shift photomask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, obtaining a pattern of the second film. The resist pattern is removed at this point. Further, while the second film pattern is used as etching mask, fluorine base dry etching is carried out for transferring the second film pattern to the halftone phase shift film to define a pattern of the halftone phase shift film and at the same time, removing the third film pattern. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift mask.

In a still further example, a halftone phase shift mask blank comprising a halftone phase shift film, an auxiliary film of chromium-containing material deposited thereon as a second film, and a light-shielding film or a light-shielding film/antireflective film of silicon-containing material deposited on the second film as a third film may be processed into a mask as follows. First, a resist film adapted for EB lithography is formed on the third film of the halftone phase shift mask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, whereby a pattern of the second film is obtained, that is, a portion of the second film where the halftone phase shift film is to be removed is removed. The resist pattern is removed at this point. A resist pattern for protecting a portion of the third film to be left is formed on the third film. Further, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed, yielding a halftone phase shift mask.

In a still further example, a halftone phase shift mask blank comprising a halftone phase shift film, an auxiliary film of chromium-containing material deposited thereon as a second film, a light-shielding film or a light-shielding film/antireflective film of silicon-containing material deposited on the second film as a third film, and an auxiliary film of chromium-containing material deposited on the third film as a fourth film may be processed into a mask as follows. First, a resist film adapted for EB lithography is formed on the fourth film of the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the fourth film, obtaining a pattern of the fourth film. While the fourth film pattern thus obtained is used as etching mask, fluorine base dry etching is carried out for transferring the fourth film pattern to the third film, obtaining a pattern of the third film. The resist pattern is removed at this point. A resist pattern for protecting a portion of the third film to be left is formed on the fourth film. Further, while the third film pattern is used as etching mask, oxygen-containing chlorine base dry etching is carried out for transferring the third film pattern to the second film, obtaining a pattern of the second film and at the same time, removing the portion of the fourth film which is not protected with the resist pattern. Next, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed and the portion of the fourth film where the resist pattern has been removed, yielding a halftone phase shift mask.

In this way, from the halftone phase shift mask blank comprising a halftone phase shift film a halftone phase shift mask comprising a transparent substrate and a mask pattern of the halftone phase shift film can be produced.

In a photolithographic method for forming a pattern with a half pitch of up to 50 nm, typically up to 30 nm, and more typically up to 20 nm in a processable substrate, comprising the steps of forming a photoresist film on the processable substrate and exposing the photoresist film to ArF excimer laser (193 nm), through a patterned mask for transferring the pattern to the photoresist film, the halftone phase shift mask of the invention is best suited for use in the exposure step.

The halftone phase shift mask obtained from the mask blank is advantageously applicable to the pattern forming process comprising projecting light to the mask pattern including the pattern of halftone phase shift film for transferring the mask pattern to an object (photoresist film) on the processable substrate. The irradiation of exposure light may be either dry exposure or immersion exposure. The halftone phase shift mask of the invention is effective particularly when a wafer of at least 300 mm as the processable substrate is exposed to a photomask pattern of light by the immersion lithography with the tendency that a cumulative irradiation energy dose increases within a relatively short time in commercial scale microfabrication.

EXAMPLE

Examples are given below for further illustrating the invention although the invention is not limited thereto.

Example 1

In a DC magnetron sputtering system, a 6025 quartz substrate of 154 mm×154 mm×6.35 mm thick was placed, with its receptive surface kept horizontal. Argon and nitrogen gases were fed as the sputtering gas. Two silicon targets having a sputter surface of diameter 170 mm were used as the target, with the sputter surfaces kept horizontal. While the substrate was rotated on its axis of rotation (extending perpendicular thereto at its center) in a horizontal direction, reactive sputtering was carried out. A halftone phase shift film consisting of silicon and nitrogen (SiN film) was deposited on the substrate, yielding a halftone phase shift mask blank.

It is assumed that the substrate has a rotational axis and a vertical line extends perpendicular to the sputter surface of each silicon target at its center. The distances between the rotational axis and the vertical lines through two silicon targets were set identical and 375 mm. Two silicon targets were arranged such that the angle included between a normal line extending from the rotational axis to the vertical line through one silicon target and a normal line extending from the rotational axis to the vertical line through the other silicon target was 144°. The flow rate of sputtering gas included 30 sccm of argon gas and 51 sccm of nitrogen gas. A power of 1,710 W was applied to one silicon target and a power of 190 W was applied to the other silicon target. Sputter deposition was carried out until a film thickness of 63 nm was reached. The sputtering conditions corresponded to the transition mode for each of the silicon targets.

The halftone phase shift film thus deposited was measured for phase shift and transmittance with respect to ArF excimer laser (wavelength 193 nm), over a region extending 95 mm diagonally from the center of film surface, finding a phase shift of 176.9 to 177.5°, a median being 177.2°, a difference between maximum and minimum of phase shift in film plane of 0.6°, a transmittance of 6.08 to 6.15%, a median being 6.115%, a difference between maximum and minimum of transmittance in film plane of 0.07%. Satisfactory in-plane uniformity of phase shift and transmittance was proven.

By XPS, the film was analyzed for composition in depth direction. The SiN film was composed of silicon and nitrogen in an atomic ratio of 47:53, corresponding to the composition of an unsaturated silicon compound having an A value in excess of 1. The composition was constant in depth direction. Because of constant composition in film thickness direction, the etching rate during mask pattern formation becomes constant in film thickness direction, suggesting that the cross-sectional profile of the mask pattern is fully vertical.

Comparative Example 1

In a DC magnetron sputtering system, a 6025 quartz substrate of 154 mm×154 mm×6.35 mm thick was placed, with its receptive surface kept horizontal. Argon and nitrogen gases were fed as the sputtering gas. One silicon target having a sputter surface of diameter 170 mm was used as the target, with the sputter surface kept horizontal. While the substrate was rotated on its axis of rotation (extending perpendicular thereto at its center) in a horizontal direction, reactive sputtering was carried out. A halftone phase shift film consisting of silicon and nitrogen (SiN film) was deposited on the substrate, yielding a halftone phase shift mask blank.

It is assumed that the substrate has a rotational axis and a vertical line extends perpendicular to the sputter surface of the silicon target at its center. The distance between the rotational axis and the vertical line through the silicon target was set 375 mm. The flow rate of sputtering gas included 30 sccm of argon gas and 50 sccm of nitrogen gas. A power of 1,900 W was applied to the silicon target. Sputter deposition was carried out until a film thickness of 63 nm was reached. The sputtering conditions corresponded to the transition mode.

By XPS, the film was analyzed for composition in depth direction. The SiN film was composed of silicon and nitrogen in an atomic ratio of 47:53, corresponding to the composition of a partially nitrided silicon compound (nitrogen/silicon atomic ratio <4/3). The composition was constant in depth direction. Because of constant composition in film thickness direction, the etching rate during mask pattern formation becomes constant in film thickness direction, suggesting that the cross-sectional profile of the mask pattern is fully vertical.

The halftone phase shift film thus deposited was measured for phase shift and transmittance with respect to ArF excimer laser (wavelength 193 nm), over a region extending 95 mm diagonally from the center of film surface, finding a phase shift of 179.6 to 180.60, a median being 180.1°, and a difference between maximum and minimum of phase shift in film plane of 1.00, indicating satisfactory in-plane uniformity of phase shift. The film showed a transmittance of 6.74 to 7.36%, a median being 7.05%, and a difference between maximum and minimum of transmittance in film plane of 0.62%, indicating poor in-plane uniformity of transmittance.

Comparative Example 2

In a DC magnetron sputtering system, a 6025 quartz substrate of 154 mm×154 mm×6.35 mm thick was placed, with its receptive surface kept horizontal. Argon and nitrogen gases were fed as the sputtering gas. One silicon target having a sputter surface of diameter 170 mm was used as the target, with the sputter surface kept horizontal. While the substrate was rotated on its axis of rotation (extending perpendicular thereto at its center) in a horizontal direction, reactive sputtering was carried out. A halftone phase shift film consisting of silicon and nitrogen (SiN film) was deposited on the substrate, yielding a halftone phase shift mask blank.

It is assumed that the substrate has a rotational axis and a vertical line extends perpendicular to the sputter surface of the silicon target at its center. The distance between the rotational axis and the vertical line through the silicon target was set 375 mm. By feeding 30 sccm of argon gas and 0 sccm of nitrogen and applying a power of 1,800 W to the silicon target, a Si layer of 10 nm thick was deposited as a first layer. Then by feeding 17 sccm of argon gas and 40 sccm of nitrogen and applying a power of 1,900 W to the silicon target, a SiN layer of 62 nm thick was deposited as a second layer. There was deposited a halftone phase shift film having a total thickness of 72 nm. The sputtering conditions corresponded to the metal mode for the first layer and the reaction mode for the second layer.

The halftone phase shift film thus deposited was measured for phase shift and transmittance with respect to ArF excimer laser (wavelength 193 nm), over a region extending 95 mm diagonally from the center of film surface, finding a phase shift of 175.8 to 177.6°, a median being 176.7°, a difference between maximum and minimum of phase shift in film plane of 1.8°, a transmittance of 6.03 to 6.12%, a median being 6.075%, and a difference between maximum and minimum of transmittance in film plane of 0.09%, indicating satisfactory in-plane uniformity of phase shift and transmittance.

By XPS, the second layer was analyzed for composition in depth direction. The SiN layer was composed of 43 at % of silicon and 57 at % of nitrogen, corresponding to the composition of a saturated silicon compound having an A value of 1. The composition in thickness direction changed stepwise at the interface between the first and second layers. Fluorine base dry etching is typically used for etching of this halftone phase shift film. The first and second layers were evaluated for etching rate. When the second layer (SiN layer) was etched under conditions providing an etching rate of 0.5 nm/sec for the first layer (Si layer), the etching rate was 0.65 nm/sec. Because of the difference of etching rate, a halftone phase shift film composed of at least two layers having different etching rates encounters a difference in lateral etching, suggesting that the cross-sectional profile of the mask pattern is less vertical.

Japanese Patent Application No. 2016-162620 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An apparatus for forming a thin film to constitute a photomask blank, comprising a substrate to constitute the photomask blank, plural targets, a gas supply for supplying a sputtering gas containing a rare gas and a nitrogen-containing gas, and means for causing electric discharge to the plural targets at the same time, wherein the thin film to constitute a photomask blank is formed by rotating the substrate on its axis, sputtering the plural targets, and depositing a thin film on the substrate, the plural targets are disposed such that provided that the rotational axis of the substrate and a vertical line passing the center of a sputter surface of each of the plural targets are parallel and spaced apart a distance, one target has the closest distance between the rotational axis and the vertical line, the distance between the rotational axis and the vertical line of another target is 1 to 3 times the distance between the rotational axis and the vertical line of the one target, and the angle included between normal lines extending from the rotational axis to vertical lines has a maximum value of 70° to 180°.

2. The apparatus of claim 1 wherein at least two normal lines extend from the rotational axis to vertical lines, and any of the angles included between adjacent normal lines is in a range of 70° to 180°.

3. The apparatus of claim 1 wherein the plural targets are silicon targets.

4. The apparatus of claim 1 wherein a halftone phase shift film formed of an unsaturated silicon compound is deposited on the substrate by reactive sputtering in transition mode.

* * * * *